United States Patent
Kim (10) Patent No.: US 7,327,631 B2
(45) Date of Patent: Feb. 5, 2008

(54) SEMICONDUCTOR MEMORY DEVICE AND METHOD OF OPERATING SEMICONDUCTOR MEMORY DEVICE

(75) Inventor: Soo-Young Kim, Seoul (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 242 days.

(21) Appl. No.: 10/755,465

(22) Filed: Jan. 13, 2004

(65) Prior Publication Data

US 2004/0160839 A1    Aug. 19, 2004

(30) Foreign Application Priority Data

Feb. 13, 2003    (KR) .................. 10-2003-0009155

(51) Int. Cl.
*G11C 7/00*    (2006.01)
(52) U.S. Cl. ............... 365/229; 365/226; 365/222; 365/189.05
(58) Field of Classification Search ........... 365/222, 365/229, 189.05
See application file for complete search history.

(56) References Cited

U.S. PATENT DOCUMENTS

| 5,367,489 | A  | * | 11/1994 | Park et al. ........... 365/189.11 |
| 5,461,591 | A  | * | 10/1995 | Kim et al. ................ 365/226 |
| 5,877,651 | A  | * | 3/1999  | Furutani .................. 327/538 |
| 6,525,972 | B2 | * | 2/2003  | Yanagisawa ........... 365/189.09 |
| 6,628,564 | B1 | * | 9/2003  | Takita et al. .......... 365/230.06 |
| 7,145,830 | B2 | * | 12/2006 | Takahashi et al. ......... 365/227 |
| 2002/0009010 | A1 | * | 1/2002 | Hayakawa ............. 365/222 |
| 2002/0060943 | A1 | * | 5/2002 | Jo ........................... 365/226 |
| 2004/0015640 | A1 | * | 1/2004 | Takahashi et al. ............ 711/1 |
| 2004/0130958 | A1 | * | 7/2004 | Takahashi et al. ......... 365/222 |

\* cited by examiner

*Primary Examiner*—Thong Q. Le
(74) *Attorney, Agent, or Firm*—Harness, Dickey & Pierce, P.L.C.

(57) ABSTRACT

A semiconductor memory device may include an oscillator circuit for generating an oscillation signal that is varied based on mode of operation, and a word line enable circuit for generating a word line enable signal in response to the oscillation signal. The device may also include a control circuit to control the oscillator circuit and the word line enable circuit, so as to control a pulse width of the word line enable signal and period of the oscillation signal, based on a change in operation mode of the device.

35 Claims, 8 Drawing Sheets

SEMICONDUCTOR MEMORY DEVICE AND METHOD OF OPERATING SEMICONDUCTOR MEMORY DEVICE

PRIORITY STATEMENT

This application claims the priority of Korean Patent Application No. 2003-09155, filed on Feb. 13, 2003, in the Korean Intellectual Property Office, the disclosure of which is hereby incorporated by reference in its entirety.

BACKGROUND OF THE INVENTION

1. Field of the Invention

The present invention relates to a semiconductor memory device and method of operating the device.

2. Description of the Related Art

A dynamic random access memory (DRAM) is widely used because of its high density and relative high speed. Since a memory cell typically consists of one transistor and one capacitor, a large number of memory cells can be integrated in DRAM. The memory cell of the DRAM is typically smaller than memory cells of other memory devices, such as a static random access memory (SDRAM), for example.

In a DRAM cell, however, charges stored in each memory cell are reduced after a given time due to leakage current. Therefore, the DRAM cells must be periodically accessed, so that data stored in the capacitors may be refreshed.

The SRAM does not require refreshing, since it includes circuits such as flip-flop circuits that can retain data. The SRAM can therefore achieve high-speed operation, as the flip-flops do not need to be refreshed. However, the flip-flops occupy substantial space per cell, and memory capacity of SRAM is smaller than the memory capacity of DRAM.

DRAM uses two refresh methods: an auto-refresh operation and a self-refresh operation. In the auto-refresh operation, a predetermined timing is allocated during a normal operation of the DRAM and the refresh operation is automatically performed during the allocated timing. A self-refresh operation is performed when the DRAM is in a stand-by mode. The auto-refresh operation and the self-refresh operation are well known in the art, thus a detailed description is omitted.

A pseudo static random access memory (PSRAM) has characteristics of both DRAM and SRAM. PSRAM has an SRAM interface and an array structure configured with DRAM cells. Unlike SRAM, PSRAM needs a refresh operation, since its array structure is configured with DRAM cells. In order to reduce power consumption, a self-refresh operation (as described above) is automatically performed when the PSRAM operates in the stand-by mode. However, there is a potential for loss of data stored in memory cells when the PSRAM is controlling the self-refresh operation while in the stand-by mode.

SUMMARY OF THE INVENTION

Exemplary embodiments of the present invention are directed to a semiconductor memory device and methods of operating the device. The device may include an oscillator circuit for generating an oscillation signal that is varied based on mode of operation, and a word line enable circuit for generating a word line enable signal in response to the oscillation signal. The device may also include a control circuit to control the oscillator circuit and the word line enable circuit, so as to control a pulse width of the word line enable signal and period of the oscillation signal, based on a change in operation mode of the device.

BRIEF DESCRIPTION OF THE DRAWINGS

The accompanying drawings, which are included to provide a further understanding of the invention and are incorporated in and constitute a part of this application, illustrate exemplary embodiments of the invention and together with the description serve to explain the principles of the exemplary embodiments of the invention. In the drawings.

DETAILED DESCRIPTION OF THE EXEMPLARY EMBODIMENTS

Reference will now be made in detail to the exemplary embodiments of the present invention, examples of which are illustrated in the accompanying drawings. Although a pseudo static random access memory (PSRAM) will be exemplarily illustrated, the exemplary embodiments of the present invention are not limited to PSRAM, the exemplary methods and devices may be applicable to other types of non-volatile memory. Rather, the exemplary embodiments herein are introduced to provide easy and complete understanding of the spirit and scope of the present invention.

Figure 1:
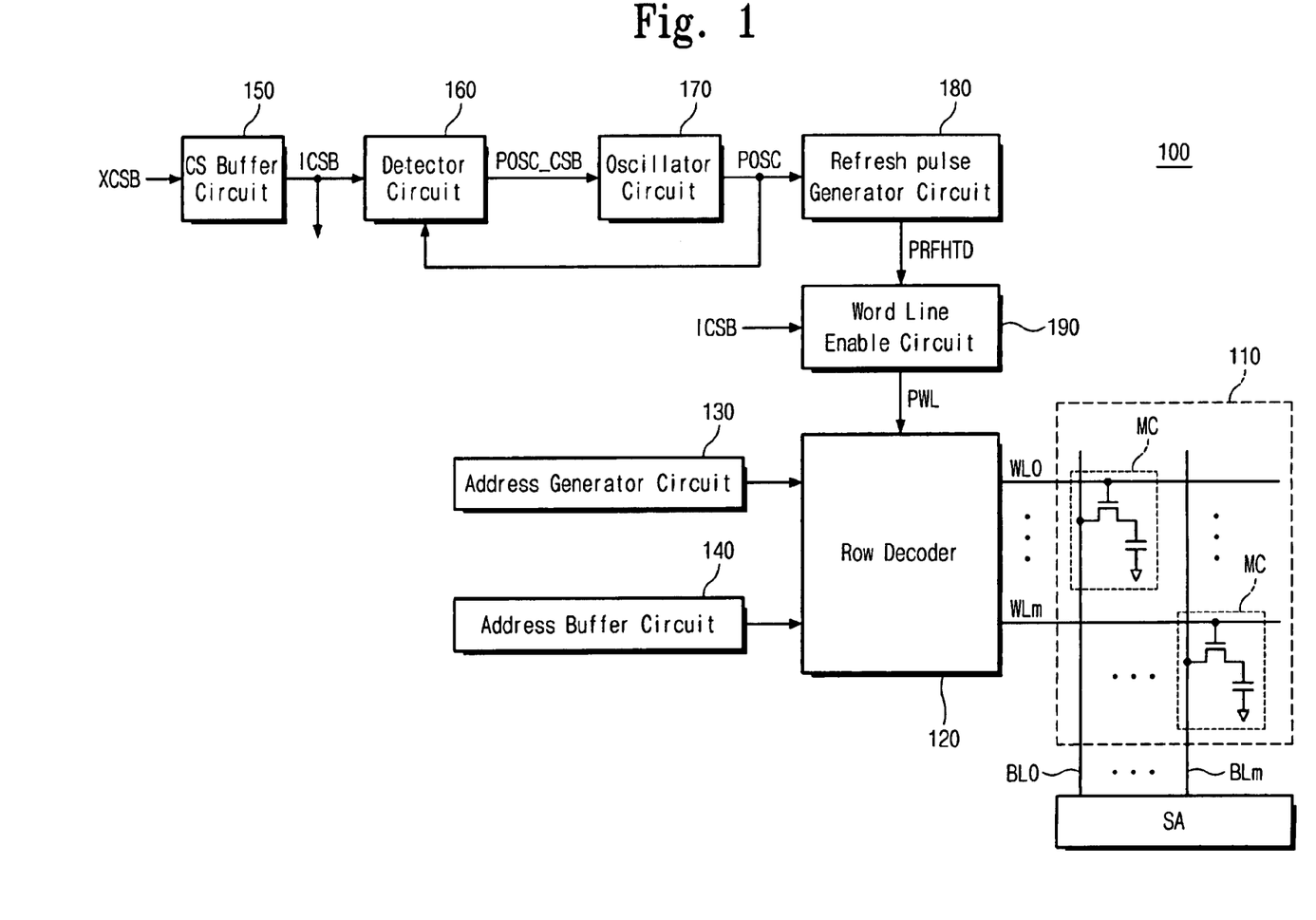
FIG. 1 is a schematic block diagram of a semiconductor memory device according to an exemplary embodiment of the present invention.

FIG. 1 is a schematic block diagram of a semiconductor memory device according to an exemplary embodiment of the present invention. Referring to FIG. 1, the semiconductor memory device 100 may be embodied as a PSRAM provided with an SRAM interface and a DRAM cell structure. The semiconductor memory device 100 may include a memory cell array 110 for storing data. The memory cell array 110 may include memory cells MC arranged in a matrix of rows (or word lines) WL0 to WLm and columns (or bit lines) BL0 to BLn. Here, each memory cell MC may be a DRAM cell consisting of one switching transistor and one capacitor, for example, although other memory cell configurations are possible as evident to those skilled in the art.

The word lines WL0 to WLm of the memory cell array 110 are connected to a row decoder circuit 120. The row decoder circuit 120 may select the word lines WL0 to WLm in response to addresses output from an address generator circuit 130 or from an address buffer circuit 140, for example. The address generator circuit 130 generates addresses for the refresh operation, and the address buffer circuit 140 buffers external addresses. The address generator circuit 130 may be provided with a refresh address counter (such a counter is generally used in DRAM).

Referring again to FIG. 1, the semiconductor memory device 100 may also include a CS buffer circuit 150 and detector circuit 160. The CS buffer circuit 150 receives an external chip select signal XCSB to output an internal chip select signal ICSB. A detector circuit 160 operates in response to the internal chip select signal ICSB and detects whether or not an operation mode of the PSRAM changes from an active mode to a stand-by mode. Once the stand-by mode starts and a given time elapses, the detector circuit 160 activates a flag signal POSC_CSB.

The semiconductor memory device 100 may also include an oscillator circuit 170. The oscillator circuit 170 generates an oscillation signal POSC having a given period. The period of the oscillation signal POSC (or, the refresh period) may be varied based on a given mode of operation. For example, the oscillation signal POSC generated during the inactive period of the flag signal POSC_CSB may have a longer period than the oscillation signal POSC generated during the active period of the flag signal POSC_CSB.

The semiconductor memory device 100 may include a refresh pulse generator circuit 180. The refresh pulse generator circuit 180 generates a refresh pulse signal PRFHTD in response to the oscillation signal POSC. The refresh pulse signal PRFHTD may have the same period as the oscillation signal POSC, but may have a pulse width narrower than the pulse width of the oscillation signal POSC.

The semiconductor memory device 100 may include a word line enable circuit 190. The word line enable circuit 190 generates a word line enable signal PWL in response to the refresh pulse signal PRFHTD. A pulse width of the word line enable signal PWL may be varied according to the internal chip select signal ICSB. According to the exemplary embodiments of the present invention, the word line enable signal PWL may have a wider pulse width when the semiconductor memory device 100 is in the stand-by mode, than when the semiconductor memory device 100 is in the active mode.

In this exemplary embodiment, the CS buffer circuit 150 and the detector circuit 160 may constitute a control circuit that controls the oscillator circuit 170 and the word line enable circuit 190. This may be done so that the pulse width of the word line enable signal PWL output of word line enable circuit 190 is increased, and so that the period of the oscillation signal POSC generated by oscillator circuit 170 is maintained without change for a given time, when the memory device 100 enters the stand-by mode from the active mode.

The standby mode of operation may be divided into first and second time periods, also known as a 'first self-refresh section' and a 'second self-refresh section'. The first and second self-refresh sections may have different characteristics with regard to one or more of pulse width of the word line enable signal PWL and refresh periods.

In accordance with the semiconductor memory device 100 of the exemplary embodiments of the present invention, the refresh period of the active mode (or the period of the oscillation signal) may be equal to a refresh period of a first self-refresh section. The first self-refresh section may be understood as a first period of time that elapses for a given, finite time after the stand-by mode begins. At the same time, the pulse width of the word line enable signal may be wider in the first self-refresh section than in the active mode. During a remaining period of the stand-by mode (the second self-refresh section), the word line enable signal has the same pulse width as the first self-refresh section, but has a longer refresh period than the first self-refresh section. The second self-refresh section may be understood as a second period of time that elapses for a given, finite time after the first self-refresh section ends.

Figure 2:
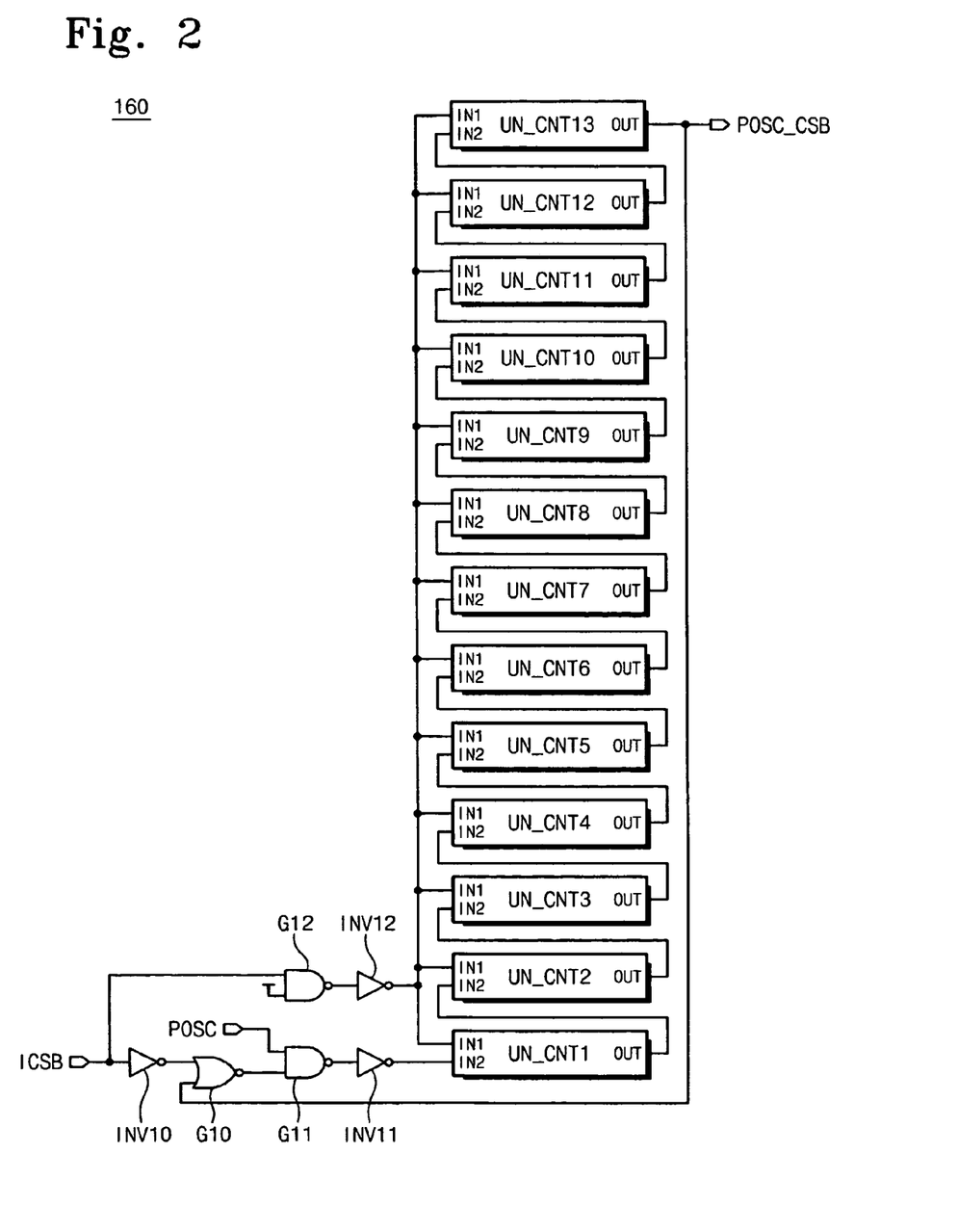
FIG. 2 a circuit diagram of the detector circuit in FIG. 1 according to an exemplary embodiment of the present invention.

FIG. 2 is a circuit diagram of the detector circuit of FIG. 1 according to an exemplary embodiment of the present invention. Referring to FIG. 2, the detector circuit 160 may include inverters INV10, INV11 and INV12, a NOR gate G10, NAND gates G11 and G12, and unit counters UN_CNT1 to UN_CNT13. Each of the unit counters UN_CNT1 to UN_CNT13 may have two input terminals IN1 and IN2 and one output terminal OUT.

An output of the inverter INV12 is applied to each input terminal IN1 of the unit counters. If the internal chip select signal ICSB is at a low level (i.e., active mode), a low level signal is input to each input terminal IN1 of the unit counters. If the internal chip select signal ICSB is at a high level (i.e., stand-by mode), a high level signal is input to each input terminal IN1 of the unit counters. An output of the inverter INV11 is applied to the input terminal IN2 of the first unit counter UN_CNT1. If the internal chip select signal ICSB is at a low level (active mode), a low level signal is input to the input terminal IN2 of the first unit counter UN_CNT1, regardless of the oscillation signal POSC. If the internal chip select signal ICSB is at a high level (stand-by mode), a clock signal responsive to the oscillation signal POSC is input to the input terminal IN2 of the first unit counter UN_CNT1. The respective outputs of the previous unit counters are applied as a clock signals to the input terminals IN2 of the next unit counters UN_CNT2 to UN_CNT13.

In detector circuit 160, the flag signal POSC_CSB changes from a low level to a high level after the chip select signal ICSB changes from a low level to a high level and then a given time elapses. In other words, after the first self-refresh section has elapsed, the flag signal POSC_OSB is activated to a high level.

Figure 3:
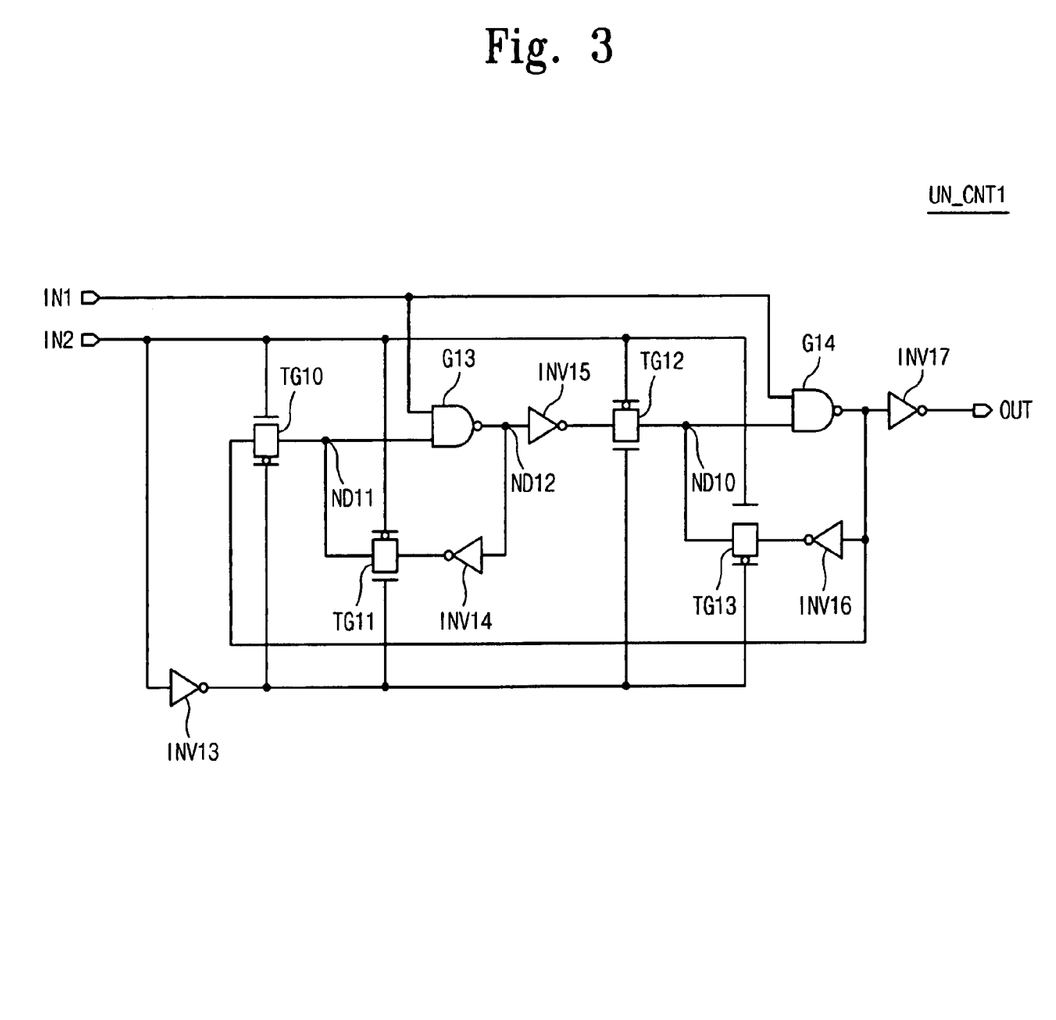
FIG. 3 is a circuit diagram of the unit counter of FIG. 2 according to an exemplary embodiment of the present invention.

FIG. 3 is a circuit diagram of a unit counter of FIG. 2 according to an exemplary embodiment of the present invention. The unit counter UN_CNT1 is described in FIG. 3, it being understood that the remaining unit counters may be configured with the same structure as the circuit of FIG. 3. Referring to FIG. 3, the unit counter UN_CNT1 includes NAND gates G13 and G14, inverters INV13 to INV17, and transmission gates TG10 to TG13, for example. The input signal IN1 is the output of inverter INV12 in FIG. 2, and the input signal IN2 is the output of inverter INV11 in FIG. 2. The output OUT is provided as a clock signal to the input terminal IN2 of the next unit counter (UN_CNT2, for example).

In the active mode, that is, when the input signal IN1 is maintained at a low level, the output OUT has a low level, regardless of the input signal IN2. In the stand-by mode, that is, when the input signal IN1 is maintained at a high level, the unit counter UN_CNT1 divides the input signal IN2 into two signals. A detailed description about the two signals will be provided below.

Since the input signal IN1 is at the high level, an output of the NAND gate G14 may be determined according to a logic state of a node ND10. When the input signals IN1 and IN2 are at a low level, the output of the NAND gate G14 becomes a high level. At this time, since the transmission gates TG11 and TG12 are turned on, the nodes ND10 and ND11 are set to a low level and the node ND12 is set to a high level.

When the input signal IN1 changes from low level to high level and the input signal IN2 is at the low level, each node is maintained in a previously set state. When the input signal IN2 changes from the low level to the high level, the transmission gates TG10 and TG13 are turned on and the transmission gates TG11 and TG12 are turned off. At this time, the node ND11 is set to a high level due to the output of the NAND gate G14, so that the node ND12 is set to a low level. As the input signal IN2 changes from high level to low level, the transmission gates TG10 and TG13 are turned off and the transmission gates TG11 and TG12 are turned on. As the node ND10 of the low level is set to the high level, the output OUT changes from the low level to the high level. Accordingly, when the input signal IN1 is at the high level, the unit counter UN_CNT1 divides the input signal IN2 into two signals.

Figure 4:
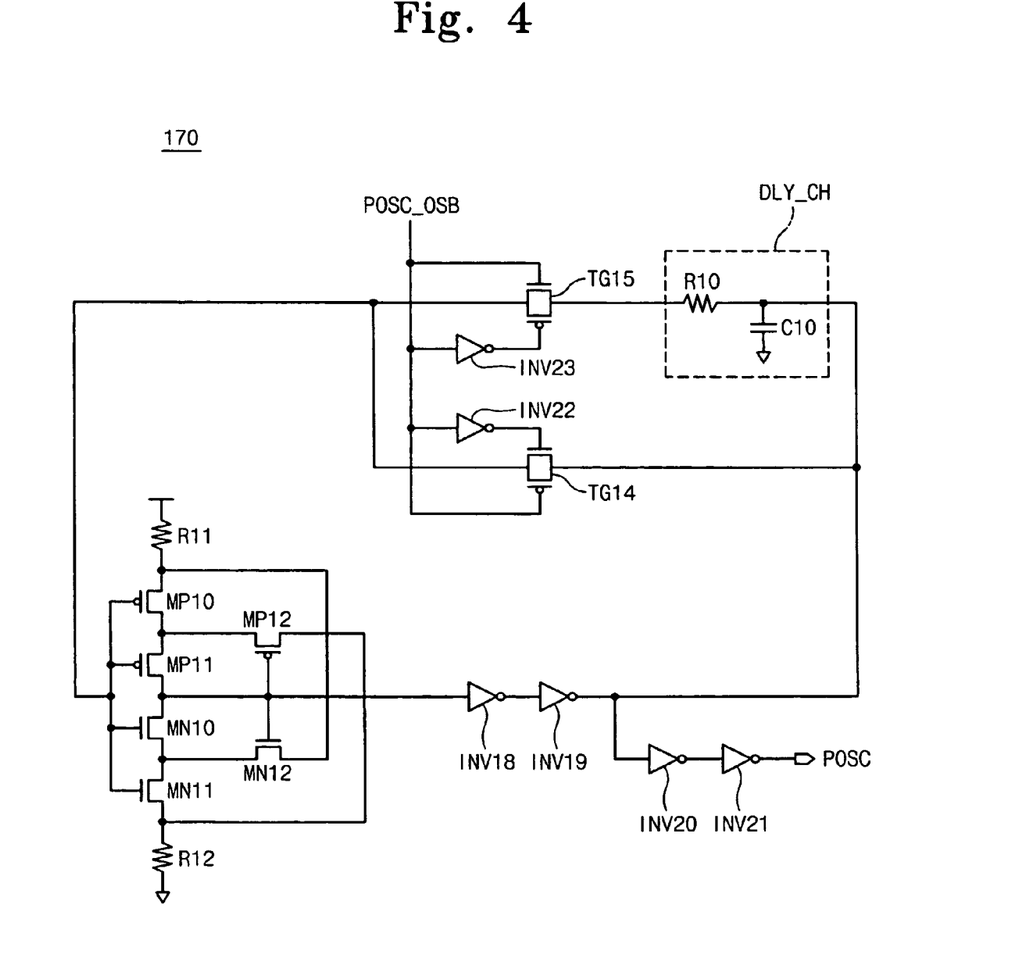
FIG. 4 is a circuit diagram of the oscillator circuit of FIG. 1 according to an exemplary embodiment of the present invention.

FIG. 4 is a circuit diagram of the oscillator circuit of FIG. 1 according to an exemplary embodiment of the present invention. Referring to FIG. 4, the oscillator circuit 170 may be a Schmitt trigger type oscillator, for example, and may include a delay chain DLY_CH provided with a resistor R10 and a capacitor C10, transmission gates TG14 and TG15, inverters INV18 to INV23, resistors R11 and R12, PMOS transistors MP10 to MP12, and NMOS transistors MN10 to MN12, as shown.

A delay time of the delay chain DLY_CH may be controlled. For example, although not shown in the drawing, the delay time of the delay chain may be controlled by connecting, in parallel, delay chains having different delay times and selecting one of the delay chains.

When the input signal POSC_OSB is at a low level (or during the active mode and/or during the first self-refresh section), transmission gate TG14 is turned on and transmission gate TG15 is turned off. Accordingly, an output of inverter INV19 may be fed back through transmission gate TG14 without passing the delay chain DLY_CH. When the input signal POSC_OSB is at a high level (or during the second self-refresh section), transmission gate TG14 is turned off and transmission gate TG15 is turned on. Accordingly, the output of the inverter INV19 may be fed back through the delay chain DLY_CH. Consequently, the period of the oscillation signal POSC (or the refresh period) may be longer in the second self-refresh section than the active mode and the first self-refresh section, due to feedback through the delay chain DLY_CH.

Figure 5:
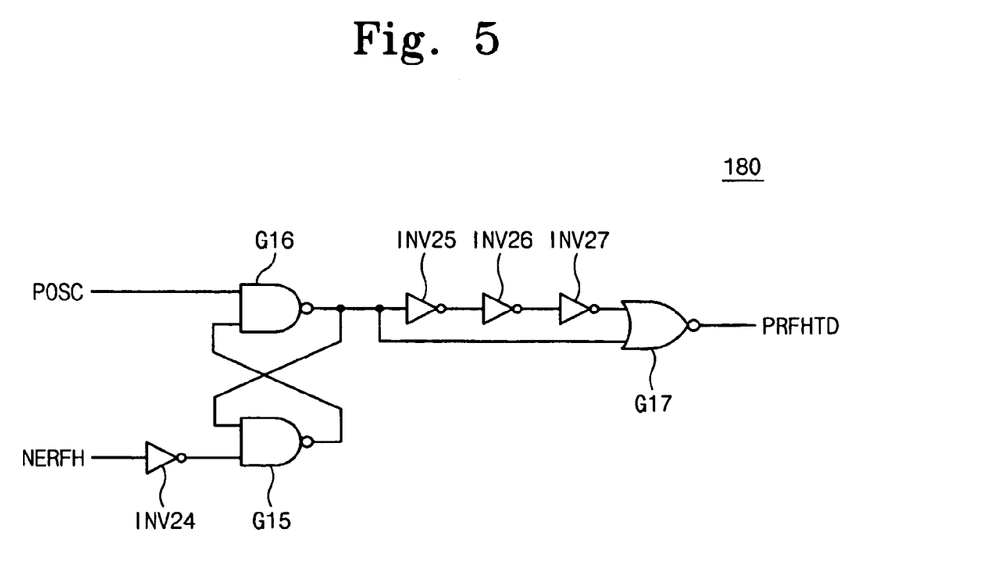
FIG. 5 is a circuit diagram of the refresh pulse generator circuit of FIG. 1 according to an exemplary embodiment of the present invention.

FIG. 5 is a circuit diagram of the refresh pulse generator circuit of FIG. 1 according to an exemplary embodiment of the present invention. Referring to FIG. 5, the refresh pulse generator circuit 180 may include inverters INV24 to INV27, NAND gates G15 and G16, and a NOR gate G17, as shown. The NAND gates G15 and G16 may be provided with flip-flops. The inverters INV25 to INV27 and NOR gate G17 may collectively provide the function of a pulse generator.

When an input signal NERFH is at a high level, the refresh pulse signal PRFHTD is maintained at a low level, regardless of the oscillation signal POSC. When the input signal NERFH is at a low level, an output of the NAND gate G16 is set to a high level. Based on these conditions, the output of the NAND gate G16 may be varied, depending on the oscillation signal POSC. For example, when the oscillation signal POSC is at a low level, the output of the NAND gate G16 may be set to a high level, and when the oscillation signal POSC is at a high level, the output of the NAND gate G16 may be set to a low level. When the output of the NAND gate G16 changes from the high level to the low level (or, when the oscillation signal POSC changes from the low level to the high level), the NOR gate G17 outputs the refresh pulse signal PRHFTD, which may be of a single pulse type, for example.

Figure 6:
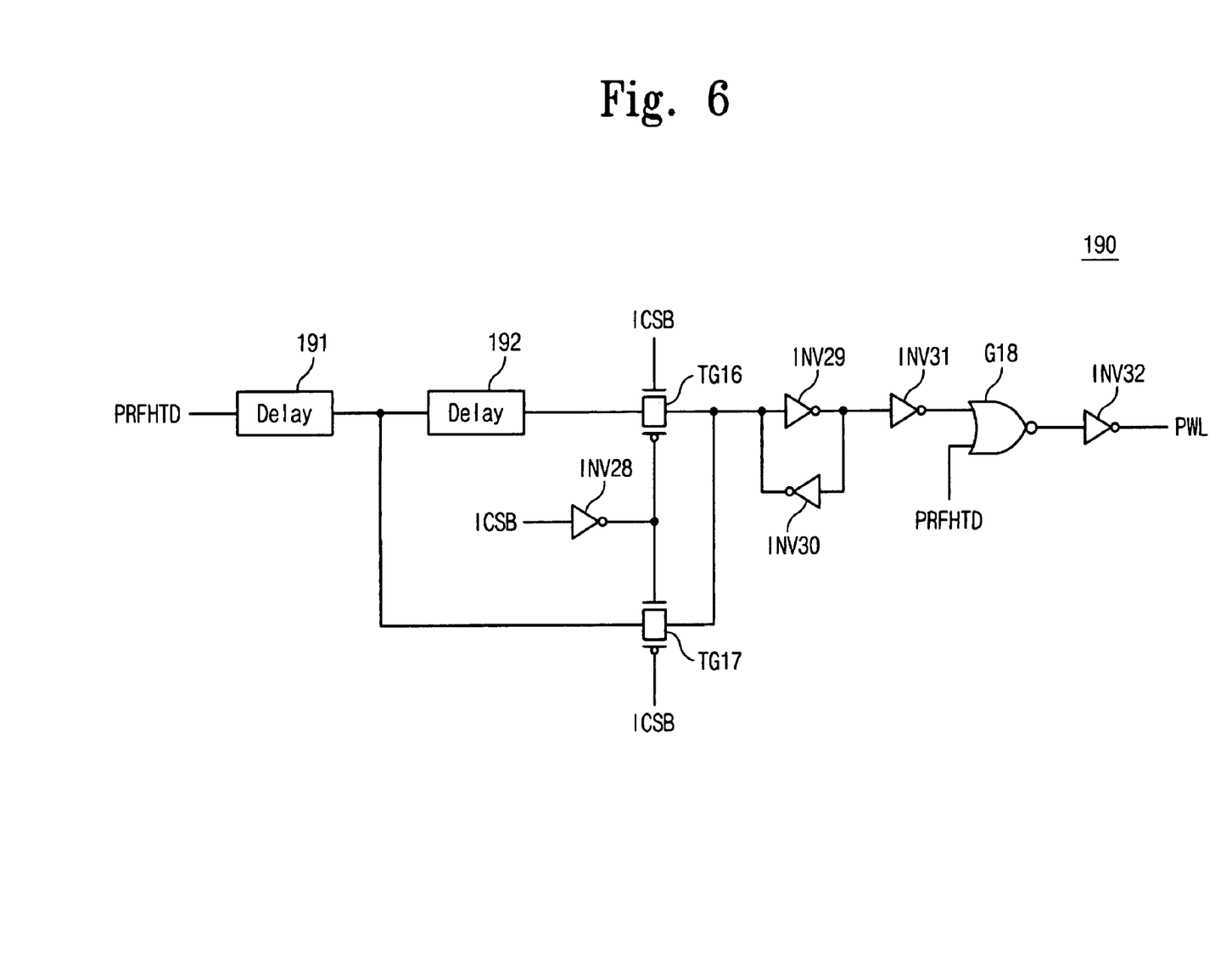
FIG. 6 is a circuit diagram of the word line enable circuit of FIG. 1 according to an exemplary embodiment of the present invention.

FIG. 6 is a circuit diagram of the word line enable circuit of FIG. 1 according to an exemplary embodiment of the present invention. Referring to FIG. 6, the word line enable circuit 190 may include delay elements 191 and 192, transmission gates TG16 and TG17, inverters INV28 to INV32, and a NOR gate G18, as shown. The word line enable circuit 190 may be a pulse generator and may have a delay time that is variable depending on a logic state of the internal chip select signal ICSB. For example, when the internal chip select signal ICSB is at a low level (that is, during the active mode), the input signal PRFHTD is input to the NOR gate G18 through a first signal delay path formed by the delay element 191, transmission gate TG17 and inverters INV29 and INV31. When the internal chip select signal ICSB is at a high level (that is, during the stand-by mode), the input signal PRFHTD is input to the NOR gate G18 through a second signal delay path formed by delay elements 191 and 192, transmission gate TG17 and inverters INV29 and INV31. Accordingly, the pulse width of the word line enable signal PWL may be wider in the stand-by mode (ICSB high) than the active mode (ICSB low).

Figure 7:
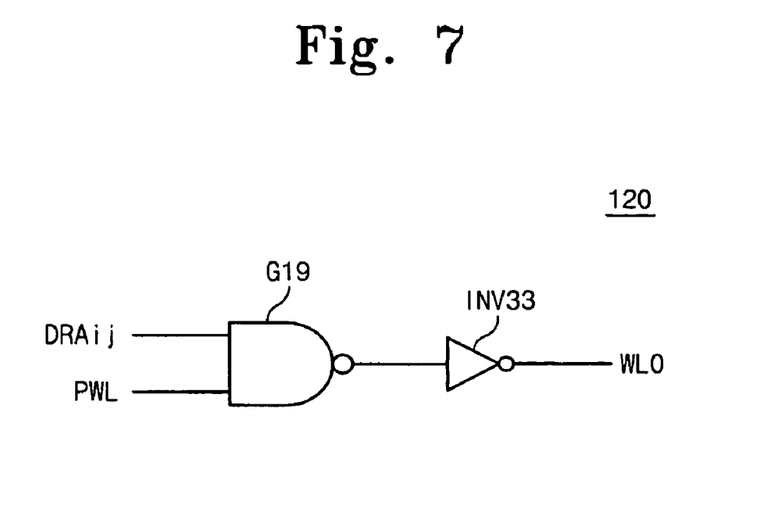
FIG. 7 is a circuit diagram of the row decoder circuit of FIG. 1 according to an exemplary embodiment of the present invention.

FIG. 7 is a circuit diagram showing a part of the row decoder of FIG. 1 according to an exemplary embodiment of the present invention. The circuit 120 of FIG. 7 corresponds to one word line and may be provided with a NAND gate G19 and an inverter INV33. Circuits corresponding to the other word lines may be configured with the same structure as shown in FIG. 7.

When the word line enable signal PWL is at a low level, the word line is set to a low level regardless of decoding signals DRAij outputted from the previous stages. When the word line enable signal PWL is at a high level, the word line WL0 is set to a low level or a high level, based on the decoding signals DRAij. Accordingly, the word line WL0 may be activated to a time duration that is as long as the activation period or pulse width of the word line enable signal PWL.

Figure 8:
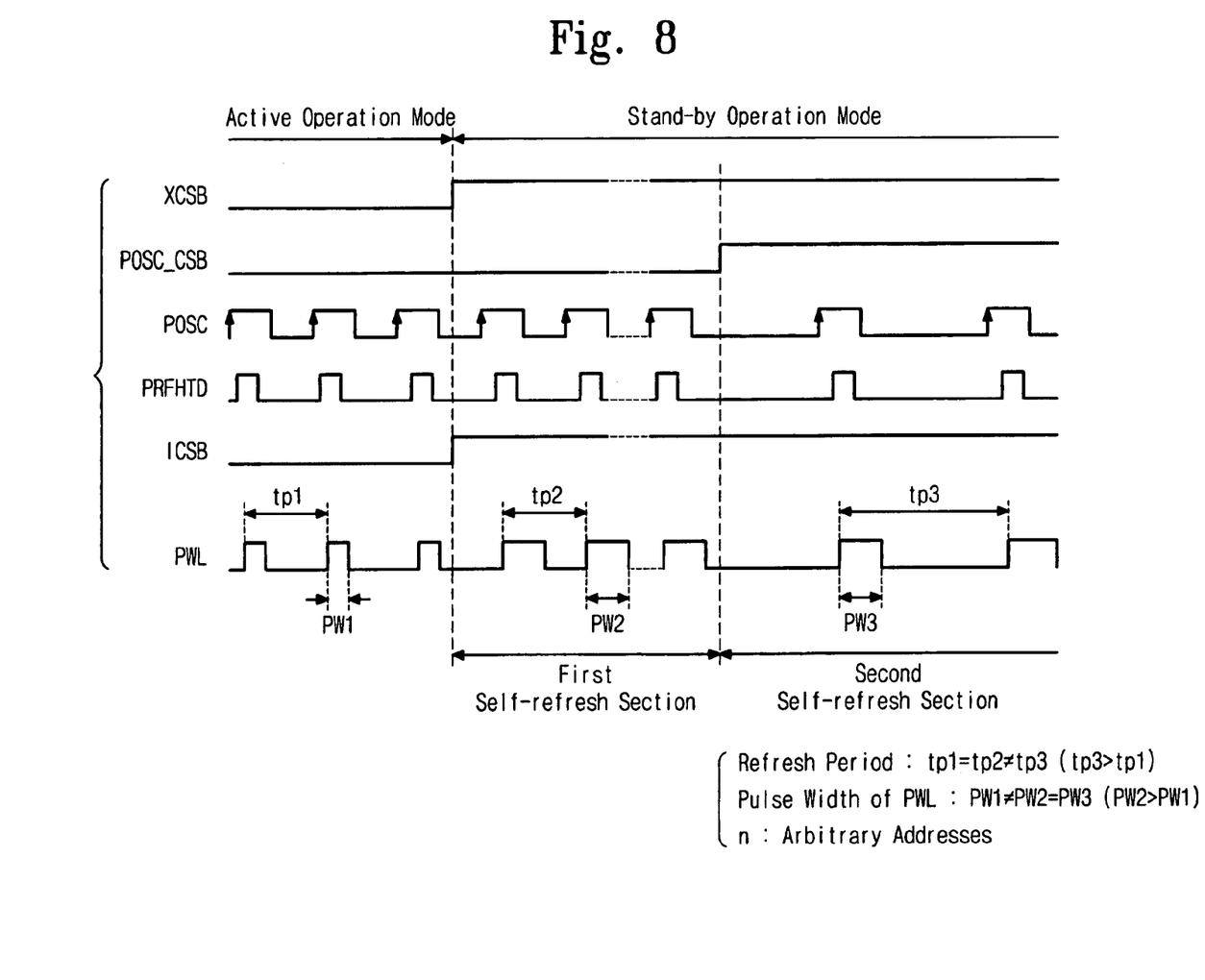
FIG. 8 is a timing chart illustrating an operation of a semiconductor memory device according to an exemplary embodiment of the present invention.

FIG. 8 is a timing chart showing an operation of a semiconductor memory device according to an exemplary embodiment of the present invention. The semiconductor memory device 100 operates in the active mode when the external chip select signal XCSB is at a low level, and operates in the stand-by mode when the external chip select signal XCSB is at a high level. When operation mode changes from the active mode to the stand-by mode, the semiconductor memory device 100 automatically performs the self-refresh operation.

In this exemplary embodiment of the present invention, the self-refresh operation may be divided into the first self-refresh section and the second self-refresh section. The pulse width of the word line enable signal may be wider in the first self-refresh section than in the active mode, but the refresh period for the first self-refresh section and the active mode may be equal, as shown in FIG. 8. The pulse width of the word line enable period may be equal in both the second self-refresh section and the first self-refresh section, but the refresh period may be longer in the second self-refresh section than the refresh period in either the active mode and/or the first self-refresh section. Accordingly, it may be possible to prevent failures from occurring in the stand-by mode based on to changes in refresh periods, when an operation mode changes from an active mode to a stand-by mode.

When the external chip select signal XCSB is at a low level, the detector circuit 160 does not operate. The oscillator circuit 170 generates the oscillator signal POSC of a first period and the refresh pulse generator circuit 180 generates the refresh pulse signal PRFHTD synchronized with the oscillation signal POSC. As can be seen in FIG. 8, the period of the oscillation signal POSC is equal to the refresh period tpl.

In the active mode, the word line enable circuit 190 outputs the word line enable signal PWL, at a pulse width PW1 that is determined through a first signal delay path (formed by the delay element 191, transmission gate TG17, and inverters INV29 and INV31 of FIG. 6) based on the low-high transition of the refresh pulse signal PRFHTD. The word line(s) selected based on the determined pulse width PW1 may be activated via row decoder circuit 120.

If the external chip select signal XCSB changes from the low level to the high level (or, if the semiconductor memory device 100 enters into the stand-by mode from the active mode), the signal delay path of the word line enable circuit 160 becomes lengthened. As can be seen in FIG. 6, when the internal chip select signal ICSB changes from a low level to a high level, the transmission gate TG17 is turned off and the transmission gate TG16 is turned on. The refresh pulse signal PRFHTD is transferred to the NOR gate G18 through the signal delay path formed by the delay elements 191 and 192 and the inverters INV29 and INV31. Accordingly, as shown in FIG. 8, the pulse width of the word line enable signal PWL in the stand-by mode is PW2, which is longer than PW1 in the active mode (where, PW2>PW1). At this time, the period of the oscillation signal POSC output from oscillator circuit 170 is equal in both the active mode and the stand-by mode, that is, tP1=tP2.

According to the semiconductor memory device 100 of the present invention, in a state where the refresh period of the first self-refresh section equals the refresh period of the active mode, the pulse width of the word line enable signal PWL is widened. All the memory cells of the array may thus be accessed during the first self-refresh section. Accordingly, since the pulse width of the word line enable signal has been widened (i.e., since the data restore time has become lengthened) in this "equal" refresh period state, it may be possible to prevent data loss from occurring during the first self-refresh section.

The detector circuit 160 then begins to perform a count operation in response to a low to high transition of the internal chip select signal ICSB. After the internal chip select signal ICSB changes from a low level to a high level and a given time elapses, the detector circuit 160 activates the flag signal POSC_OSB indicating the end of the first self-refresh section. As the flag signal POSC_OSB is activated, the feedback path of the oscillator circuit 170 is formed through the delay chain DLY_CH. As a result, the period of the oscillation signal POSC becomes tP3, which is longer than tP2. At this time, and as shown in FIG. 8, the pulse width of the word line enable signal PWL in the second self-refresh section is equal to that in the first self-refresh section, that is, PW2=PW1.

In the semiconductor memory device described above in the exemplary embodiments of the present invention, and in a state that the pulse width of the word line enable signal PWL in the second self-refresh section is equal to the pulse width in the first self-refresh section, the refresh period tP3 in the second self-refresh section becomes longer than the refresh period tP2 in the first self-refresh section.

As described above, the pulse width of the word line enable signal is only widened in a state the refresh period in the first self-refresh section is equal to that in the active mode. Since the pulse width of the word line enable signal is widened (or since the data restore time becomes longer) in a state that the refresh period in the first self-refresh period is equal to that in the active mode, it is possible to prevent data loss that may occur during the self-refresh period.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor memory device, comprising:
   an oscillator circuit for generating an oscillation signal that varies based on a mode of operation;
   a word line enable circuit for generating a word line enable signal in response to the oscillation signal; and
   a control circuit for controlling the oscillator circuit and the word line enable circuit so that as the operation mode of the memory device changes from an active mode to a stand-by mode, a pulse width of the word line enable signal is widened, and a period of the oscillation signal is lengthened after a given time elapses from the beginning of the stand-by mode.

2. The device of claim 1, the device including an array of memory cells arranged in row and columns, wherein all of the memory cells are refreshed for the given time to restore data therein.

3. The device of claim 1, wherein the period of the oscillation signal is equal to a refresh period.

4. The device of claim 3, wherein the control circuit controls the refresh period and the pulse width of the word line enable signal in response to a chip select signal.

5. The device of claim 1, wherein the pulse width of the word line enable signal is maintained equally during a refresh section of the stand-by mode.

6. A semiconductor memory device including an array of memory cells arranged in row and columns, comprising:
   a flag signal generator circuit for generating a flag signal indicating an end of a first refresh section of a stand-by mode of operation, after a given time elapses from a start of the stand-by mode;
   an oscillator circuit for generating a variable oscillation signal in response to the flag signal;
   a word line enable circuit generating a word line enable signal in response to the oscillation signal; and
   a row decoder circuit for selecting rows in response to row addresses and driving the selected rows during an activation period of the word line enable signal.

7. The device of claim 6, wherein the pulse width of the word line enable signal varies based on mode of operation of the device.

8. The device of claim 7, wherein
   the stand-by mode of operation spans a period of time that includes the first refresh section and a second refresh section, and
   the oscillation signal generated in the first refresh section has a shorter period than the oscillation signal generated in the second refresh section.

9. The device of claim 6, wherein the flag signal generator circuit activates the flag signal after a given time elapses from an inactivation of a chip select signal.

10. The device of claim 9, wherein a pulse width of the word line enable circuit is varied according to the chip select signal.

11. The device of claim 6, wherein a word line enable signal that is generated during the first refresh section has a wider pulse width than a word line enable signal generated when the device is in an active mode of operation.

12. The device of claim 6, wherein the period of the oscillation signal in the first refresh section is equal to the period of the oscillation signal when the device is in an active mode of operation.

13. The device of claim 8, wherein the pulse width of the word line enable signal in the first refresh section is equal to the pulse width of the word line enable signal in the second refresh section.

14. The device of claim 6, wherein the flag signal generator circuit includes a counter operating in synchronization with the oscillation signal.

15. The device of claim 6, wherein the memory device is a pseudo static random access memory (PSRAM) having dynamic random access memory (DRAM) cells as the memory cells.

16. A semiconductor memory device including an array of memory cells arranged in row and columns, comprising:
    a detector circuit activating a flag signal as a result of a detection of a given time that has elapsed from a beginning of a stand-by mode of operation of the device;
    an oscillator circuit for generating an oscillation signal based on the flag signal;
    a word line enable circuit for generating a word line enable signal that is synchronized with the oscillation signal; and
    a row decoder circuit for selecting rows in response to row addresses and driving the selected rows during an active period of the word line enable signal.

17. The device of claim 16, wherein the oscillation signal has a first period during an inactive period of the flag signal and a second period during an active period of the flag signal.

18. The device of claim 17, wherein the second period is longer than the first period.

19. The device of claim 16, wherein a pulse width of the word line enable signal is widened at the beginning of the stand-by mode.

20. The device of claim 16, wherein the detector circuit includes a counter operating in synchronization with the oscillation signal.

21. The device of claim 16, wherein the memory cells are refreshed one time for the given time.

22. The device of claim 17, wherein the inactive period of the flag signal includes an active mode of operation and a first refresh section of the stand-by mode of operation, and the active period of the flag signal includes a second refresh section of the stand-by mode.

23. The device of claim 16, wherein the memory device includes a pseudo static random access memory (PSRAM) having dynamic random access memory (DRAM) cells as the memory cells.

24. A method of operating a semiconductor memory device having an active mode of operation and a stand-by mode of operation, comprising:
    generating a flag signal indicating an end of a first refresh section of the stand-by mode, the flag signal having an inactive period and an active period, the inactive period including the active mode and the first refresh section of the stand-by mode, the inactive period including a second refresh section of the stand-by mode;
    generating an oscillation signal during the stand-by mode in response to the flag signal, the oscillation signal being generated in the first refresh section having a shorter period than the oscillation signal being generated during the second refresh section; and
    generating a word line enable signal in response to the oscillation signal, the word line enable signal having a pulse width that varies depending on the mode of operation of the device.

25. The method of claim 24, wherein the word line enable signal generated during the first refresh section of the stand-by mode has a wider pulse width than the word line enable signal generated during the active mode.

26. A semiconductor memory device that is operated in accordance with the method of claim 24.

27. A control circuit for a semiconductor memory device, the device having an oscillation circuit for generating an oscillation signal and a word line enable circuit for generating a word line enable signal in response to the oscillation signal, the control circuit comprising:
    a buffer circuit; and
    a detector circuit,
    wherein
        the buffer circuit outputs a chip select signal to the detector circuit and the word line enable circuit,
        the detector circuit generates a flag signal for controlling the oscillation circuit based on a detection of a change in operation mode of the device
        the device has an active mode of operation and a stand-by mode of operation,
        the stand-by mode of operation spans a duration that includes at least two periods of time, represented as a first refresh section and a second refresh section, and
        the detector circuit controls the oscillator circuit so that the period of the oscillation signal is lengthened after the first refresh section has elapsed, so that the period of the oscillation signal is the same in the active mode and in the first refresh section, and longer in the second refresh section.

28. The control circuit of claim 27, wherein the buffer circuit and detector circuit control the word line enable circuit so that a pulse width of the word line enable signal is widened as the device changes from an active mode of operation to a stand-by mode of operation.

29. The control circuit of claim 27, wherein
    the flag signal has an inactive period and an active period,
    the inactive period of the flag signal includes the active mode and the first refresh section of the stand-by mode, and
    the active period of the flag signal includes the second refresh section.

30. The control circuit of claim 27, wherein the buffer circuit and detector circuit control the word line enable circuit so that a pulse width of the word line enable signal is wider in the first refresh section of the stand-by mode of operation than in the active mode.

31. The control circuit of claim 30, wherein the pulse width of the word line enable signal in the second refresh section is the same as in the first refresh section of the stand-by mode.

32. A method of controlling operation of a semiconductor memory device that includes a control circuit for controlling an oscillation circuit and a word line enable circuit, the method comprising:
controlling a length of a period of the oscillation signal generated by the oscillation circuit and a pulse width of a word line enable signal generated by the word line enable circuit in response to the oscillation signal, based on a change in mode of operation of the device, and the pulse width of the word line enable signal being widened based on the change in the mode of operation of the device while the period of the oscillation signal is lengthened after a given time elapses from the initial change in the mode of operation of the device.

33. A semiconductor memory device, the operation of which is controlled in accordance with the method of claim 32.

34. A semiconductor memory device, comprising:
an oscillator circuit for generating an oscillation signal that varies based on a mode of operation;
a word line enable circuit for generating a word line enable signal in response to the oscillation signal; and
a control circuit for controlling the oscillator circuit and the word line enable circuit so that a pulse width of the word line enable signal is widened while a period of the oscillation signal is maintained as operation mode of the memory device changes from an active mode to a stand-by mode.

35. A control circuit for a semiconductor memory device, the device having an oscillation circuit for generating an oscillation signal and a word line enable circuit for generating a word line enable signal in response to the oscillation signal, the control circuit comprising:
a buffer circuit; and
a detector circuit,
wherein
the buffer circuit outputs a chip select signal to the detector circuit and the word line enable circuit,
the detector circuit generates a flag signal for controlling the oscillation circuit based on a detection of a change in operation mode of the device, and
the buffer circuit and detector circuit control the oscillating circuit so that a period of the oscillation signal is maintained for a given period of time as the device changes mode of operation.

* * * * *